US010749218B2

(12) United States Patent
Hawley et al.

(10) Patent No.: US 10,749,218 B2
(45) Date of Patent: Aug. 18, 2020

(54) CIRCUITRY FOR CHARGING A MULTI-STACK BATTERY PACK

(71) Applicant: QUALCOMM Incorporated, San Diego, CA (US)

(72) Inventors: Steve Hawley, Emerald Hills, CA (US); Giuseppe Pinto, San Francisco, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/169,105

(22) Filed: Oct. 24, 2018

(65) Prior Publication Data

US 2019/0148795 A1 May 16, 2019

Related U.S. Application Data

(60) Provisional application No. 62/584,654, filed on Nov. 10, 2017.

(51) Int. Cl.

| | |
|---|---|
| ***H01M 10/44*** | (2006.01) |
| ***H01M 10/46*** | (2006.01) |
| ***H02J 7/00*** | (2006.01) |
| ***H02M 3/158*** | (2006.01) |
| ***H02M 3/07*** | (2006.01) |
| ***G01R 31/36*** | (2020.01) |
| *G01R 19/165* | (2006.01) |
| *H02M 3/156* | (2006.01) |
| *H02M 1/00* | (2006.01) |

(52) U.S. Cl.

CPC .......... *H01M 10/441* (2013.01); *G01R 31/36* (2013.01); *H01M 10/46* (2013.01); *H02J 7/0014* (2013.01); *H02J 7/007184* (2020.01); *H02M 3/07* (2013.01); *H02M 3/1584* (2013.01); *G01R 19/16519* (2013.01); *H02J 7/0026* (2013.01); *H02M 3/156* (2013.01); *H02M 2001/0093* (2013.01)

(58) Field of Classification Search

CPC .... H01M 10/441; H01M 10/46; H02J 7/0014; H02J 7/0081; H02J 7/0026; G01R 19/16519; H02M 3/07; H02M 3/1584

USPC .......................................................... 320/134

See application file for complete search history.

(56) References Cited

U.S. PATENT DOCUMENTS 3,943,428 A * 3/1976 Whidden ................ H02M 3/07 363/60
5,552,692 A * 9/1996 McKillop ............ H02J 7/0054 320/137

(Continued)

FOREIGN PATENT DOCUMENTS

KR 20160098863 8/2016

*Primary Examiner* — Sun J Lin
(74) *Attorney, Agent, or Firm* — Holland and Hart LLP-CLX/Qualcomm Incorporated

(57) ABSTRACT

Certain aspects of the present disclosure provide apparatus and techniques for charging a multi-stack battery pack. For example, certain aspects provide a circuit for charging a battery pack having multiple battery cells. The circuit generally includes a voltage regulator circuit and charge pump circuitry having an input coupled to an output of the voltage regulator circuit, and an output coupled to a first battery charging terminal. In certain aspects, the first battery charging terminal may be configured to be coupled to a terminal of a first battery cell of the multiple battery of the battery pack.

30 Claims, 12 Drawing Sheets

200C
210B
Battery Pack
Vbat
(6.0V to 9.0V)
Battery
212
224
Output
CP
Input
C226B
Ref
Vin
(5.0V to 20V)
102
Power Source
Vsense
Isense
Switch
SD Battery charger
204A
Vsw
106
108
Vsys
(3.0V to 4.5V)
Battery
214

(56) References Cited

U.S. PATENT DOCUMENTS 5,592,067 A * 1/1997 Peter et al. ........... H02J 7/0018 320/103
5,672,952 A * 9/1997 Szepesi ................. H02J 7/0031 320/164
5,747,968 A * 5/1998 Merritt et al. ........ H02J 7/0016 320/119
5,783,322 A * 7/1998 Nagai et al. .......... H01M 10/48 429/7
6,300,820 B1 * 10/2001 Fotouhi et al. ......... H02M 3/07 327/536
6,304,467 B1 * 10/2001 Nebrigic ............... H02J 7/0065 363/49
6,717,458 B1 * 4/2004 Potanin ................... H02M 3/07 327/306
7,550,954 B2 * 6/2009 De Nisi et al. ......... H02M 1/10 307/45
7,595,608 B2 * 9/2009 Gangstoe et al. .... H02J 7/0031 320/128
7,626,360 B2 * 12/2009 Melanson ............. H02J 7/0031 320/127
7,737,658 B2 6/2010 Sennami et al.
7,902,596 B2 * 3/2011 Kitamura et al. ........................... H01L 29/66666 257/329
7,990,108 B2 * 8/2011 Aas et al. ............. H02J 7/0031 320/112
8,154,334 B2 * 4/2012 Wang et al. ........ H02M 3/1588 327/536
8,228,023 B2 * 7/2012 Sather et al. ....... H01M 2/0275 29/623.1
8,416,549 B2 * 4/2013 Migliavacca ......... H02J 7/0031 361/91.1
8,450,986 B2 * 5/2013 Imura et al. ............ G05F 1/573 323/277
8,994,335 B2 * 3/2015 Tagami et al. ........ H02J 7/0024 320/118
10,097,026 B2 * 10/2018 Johnson et al. .......... H02J 7/00
2002/0125872 A1 * 9/2002 Groom et al. ........ H02M 3/156 323/288
2013/0038289 A1 2/2013 Tse
2014/0084869 A1 3/2014 Ryu et al.
2015/0236538 A1 8/2015 Cai et al.

* cited by examiner

CIRCUITRY FOR CHARGING A MULTI-STACK BATTERY PACK

CROSS-REFERENCE TO RELATED APPLICATIONS

This application claims benefit of U.S. Provisional Patent Application Ser. No. 62/584,654, filed Nov. 10, 2017, which is expressly incorporated herein by reference in its entirety.

BACKGROUND

A battery pack consisting of multiple stacked batteries is capable of providing a wide voltage range to electronic systems, such as telecommunication systems, computing systems, drones, and automotive systems (including electric vehicle systems). A battery charger providing either a constant voltage output or constant current output may be used to recharge the batteries in the battery pack.

SUMMARY

Certain aspects of the present disclosure relate generally to battery chargers, and more particularly to circuitry for charging a multi-stack battery pack.

Certain aspects of the present disclosure provide a circuit for charging a battery pack. The circuit generally includes a voltage regulator and charge pump circuitry having an input coupled to an output of the voltage regulator, and an output coupled to a first battery charging terminal. In certain aspects, the first battery charging terminal may be configured to couple to a terminal of a first battery cell of the battery pack having multiple battery cells.

Certain aspects of the present disclosure provide a method for charging a battery pack. The method generally includes generating a regulated voltage based on input voltage; generating a charging signal, via a first charge pump, based on the regulated voltage, the charging signal having a higher voltage than the regulated voltage; and charging a battery pack having multiple battery cells via the charging signal.

Certain aspects of the present disclosure provide a circuit for charging a battery pack. The circuit generally includes a battery pack having multiple battery cells, a voltage regulator, and charge pump circuitry having an input coupled to an output of the voltage regulator and an output coupled to a first terminal of the first battery cell of the multiple battery cells.

BRIEF DESCRIPTION OF THE DRAWINGS

The accompanying drawings, which are incorporated herein and constitute part of this specification, illustrate examples described in the disclosure, and together with the general description given above and the detailed description given below, serve to explain the features of the various implementations.

DETAILED DESCRIPTION

Various implementations will be described in detail with reference to the accompanying drawings. Wherever possible, the same reference numbers may be used throughout the drawings to refer to the same or like parts. Different reference numbers may be used to refer to different, same, or similar parts. References made to particular examples and implementations are for illustrative purposes, and are not intended to limit the scope of the disclosure or the claims.

Figure 1A:
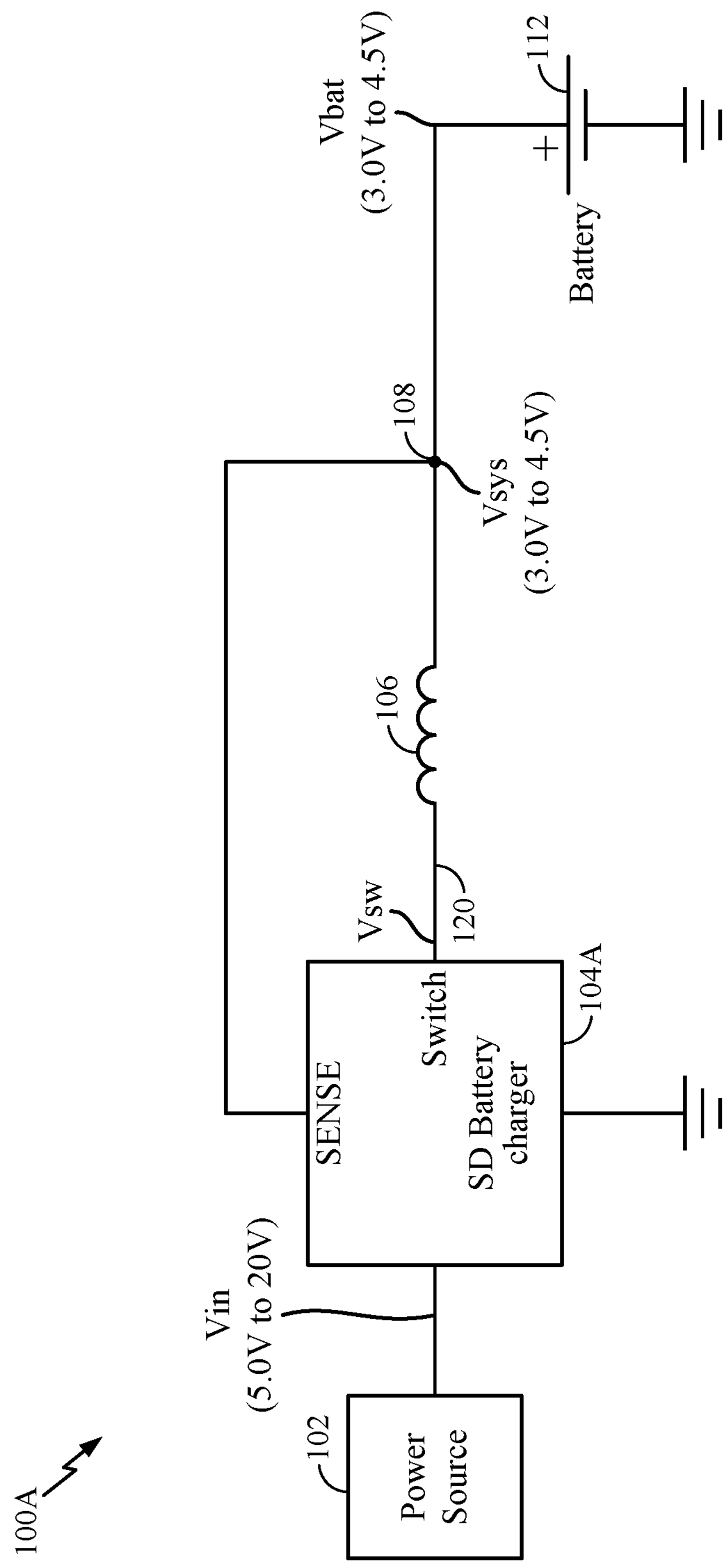
FIG. 1A is a block diagram depicting an example circuit for charging a battery.

FIG. 1A is a block diagram illustrating a circuit 100A for charging a battery 112. The circuit 100A may include a power source 102 for generating an input voltage (Vin) to be provided to battery charger 104A (e.g., a step-down (SD) battery charger). In certain aspects, the battery charger may be a switch-mode battery charger (also referred to as a "switch-mode voltage regulator") implemented with inductive element 106 disposed external to the battery charger 104A, as illustrated. The battery charger may be used to charge a battery 112, as described in more detail herein.

In certain aspects, the circuit 100A may optionally include an adapter (not shown) configured to receive power from the power source 102 and to deliver power to an input terminal of the battery charger 104A. The adapter may be configured to interface with computing equipment, including mobile computing equipment, laptop/notebook computers, and drones. Accordingly, in a non-limiting example, the adapter may be a Universal Serial Bus (USB) adapter, a 30-pin Apple™ adapter, a Lightning™ adapter, an X connector adapter, a star connector adapter, a spider connector adapter, or any other type of adapter designed to interface with computing equipment. The adapter may be an adapter configured to interface with an electric vehicle charging system. Accordingly, in a non-limiting example, the adapter may be a Domestic Socket, a Schuko or CEE plug, a Type 1 or Yazaki plug, a Type 2 or Mennekes plug, a Type 3 or Scame plug, a Type 4 or CHAdeMO™ plug, a Combined Charging System (CSS) plug, a Tesla Supercharger, or any other type of adapter designed to interface with an electric vehicle charging system. In certain aspects, the battery charger 104A may wirelessly receive power from the power source 102 via an antenna (not shown).

The power source 102 may be connected to the input of the battery charger 104A. The battery charger 104A may be implemented as a buck converter having a switch output connected to a first terminal of the inductive element 106. Another input of the battery charger 104A may be connected to a reference potential node (e.g., electric ground), as illustrated. The inductive element 106 may be connected between a system node 108 (also referred to as a "system voltage supply node") and the switch output of the battery charger 104A. The system node may be coupled to a positive terminal of the battery 112 and used to provide power for charging the battery 112, as well as providing power to one or more components of an electronic device having the circuit 100A. The system node 108 may be connected to a voltage sense (Vsense) input of the battery charger 104A. In certain aspects, the negative terminal of the battery 112 may be connected to the reference potential node. Accordingly, in this configuration, the battery voltage (Vbat) at the positive terminal of battery 112 and the system voltage (Vsys) (also referred to as a "voltage supply signal") at the system node 108 may be the same or substantially the same voltage. In certain aspects, the circuit 100A may be implemented without the inductive element 106. For example, the switch output of the battery charger 104A may be connected to the positive terminal of the battery 112. Although not shown, system node 108 may connect to an input of an external regulator (e.g., a power module integrated circuit (PMIC)), computing equipment (including mobile computing equipment, laptop/notebook computers, and drones), telecommunication equipment, automotive systems (including an electric vehicle charging system), or boating systems.

In certain aspects, the power source 102 may provide a direct-current (DC) input voltage Vin to the battery charger 104A, such as any voltage within an inclusive range of 5.0V-10% (or 4.5V) and 20.0V+10% (or 22V). The power source 102 may be any type of circuit or instrument that generates a voltage, such as, a power supply, an alternating current (AC) adapter, a DC adapter, an AC/DC converter, a transformer, a motor-generator, a voltage regulator, a low-dropout (LDO) regulator, a switching regulator, a bandgap voltage generator, a battery, fuel cells, alternator, or solar power converters.

The battery charger 104A may generate any DC output voltage at the system node 108, such as any voltage within an inclusive range of 3.0V-10% (2.7V) to 4.5V+10% (4.95V). The battery 112 may store a voltage, such as any voltage within an inclusive range of 3.0V-10% (2.7V) to 4.5V+10% (4.95V).

As shown in FIG. 1A, the topology of the battery charger 104A and inductive element 106 form an inductive switching regulator, referred to as a buck converter, that circuit 100A uses to charge battery 112. The battery charger 104A charges battery 112 by generating a voltage at the system node 108 that is less than the input voltage Vin received from the power source 102 and is within the charging specifications for the battery 112. The battery charger 104A also regulates the charging of the battery 112 by monitoring the system voltage (e.g., battery voltage Vbat) received at the sense input of the battery charger 104A via a feedback path connected to system node 108, calculating a difference between a target voltage at the system node 108 and the sensed voltage at the system node 108, and controlling the signal at node 120 until the target voltage at the system node 108 and the sensed voltage at the system node 108 are equal. Thus, the battery charger 104A generates the voltage at the system node 120 by regulating the input voltage Vin by an amount that is a function of the input voltage Vin, the charging specifications for the battery 112, and any differences between the target voltage at the system node 108 and the sensed voltage at the system node 108. In a non-limiting example, the battery charger 104A may charge a 3.0V battery by stepping-down a 20V input voltage Vin by 17.0V or a 5V input voltage Vin by 2.0V. In another non-limiting example, the battery charger 104A may charge a 4.5V battery by stepping down a 20V input voltage Vin by 15.5V or a 5V input voltage Vin by 0.5V. In certain aspects, the input voltage Vin is greater than or equal to the battery voltage Vbat when circuit 100A is charging the battery 112. In certain aspects, the input voltage Vin may be less than the battery voltage Vbat when circuit 100A is not charging battery 112 such as when power source 102 is powered-down or disconnected from the battery charger 104A.

Figure 1B:
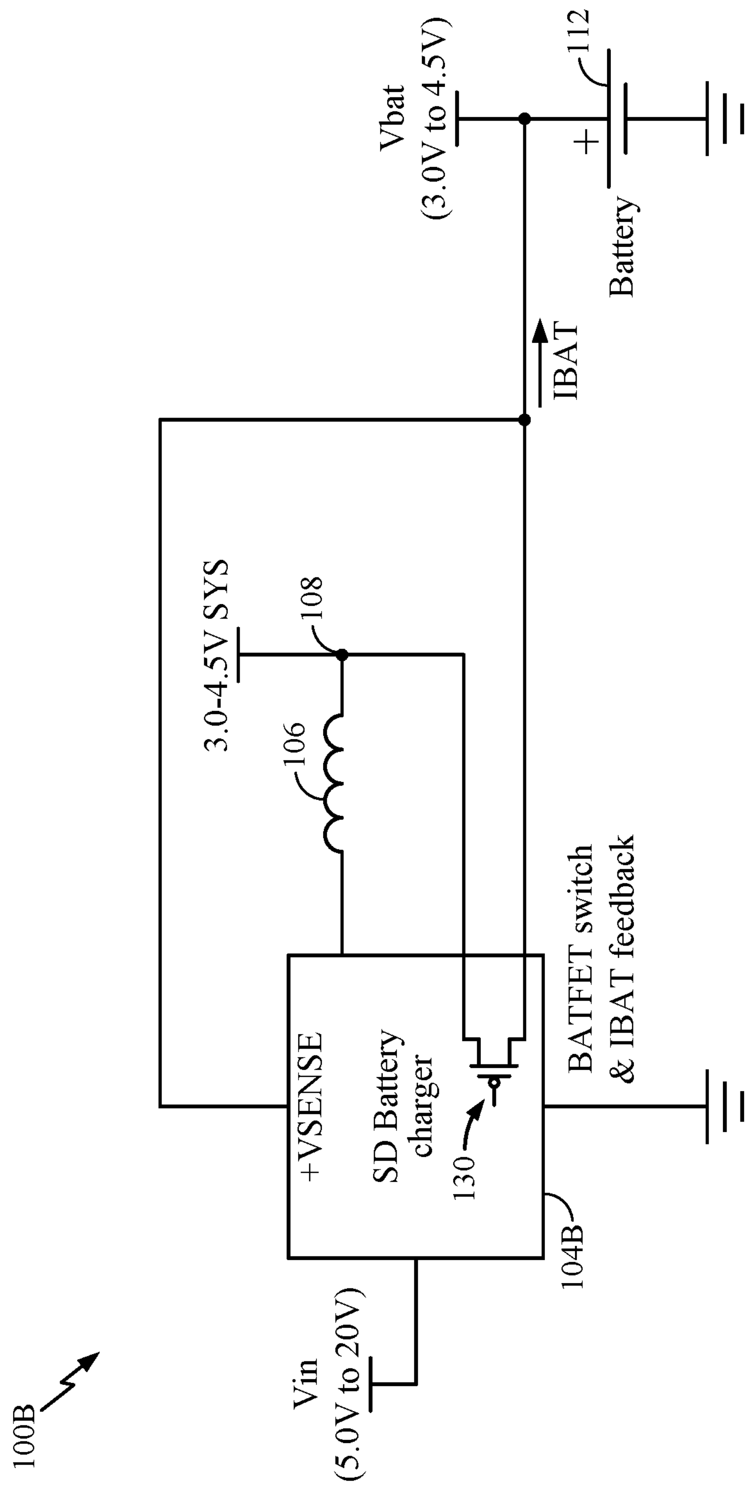
FIG. 1B is a block diagram illustrating an example circuit for charging a battery implemented with a battery charger having a current sense transistor.

FIG. 1B is a block diagram illustrating an example circuit 100B for charging a battery implemented with a battery charger having a current sense transistor. As illustrated, the battery charger 104B includes a transistor 130 (e.g., implemented as a p-type metal-oxide-semiconductor (PMOS) transistor) for sensing the amount of current (IBAT) supplied to the battery 112. For example, the on-resistance of the transistor 130 may be known, and thus, based on the voltage drop between the drain and the source of transistor 130, the amount of current IBAT may be determined. The current IBAT may also be regulated by controlling the drive voltage (e.g., gate voltage) of the transistor 130. For certain aspects, the transistor 130 may be referred to as a battery field-effect transistor (BATFET), as shown.

Charging a Balanced Double-Stack Battery Pack

Figure 2A:
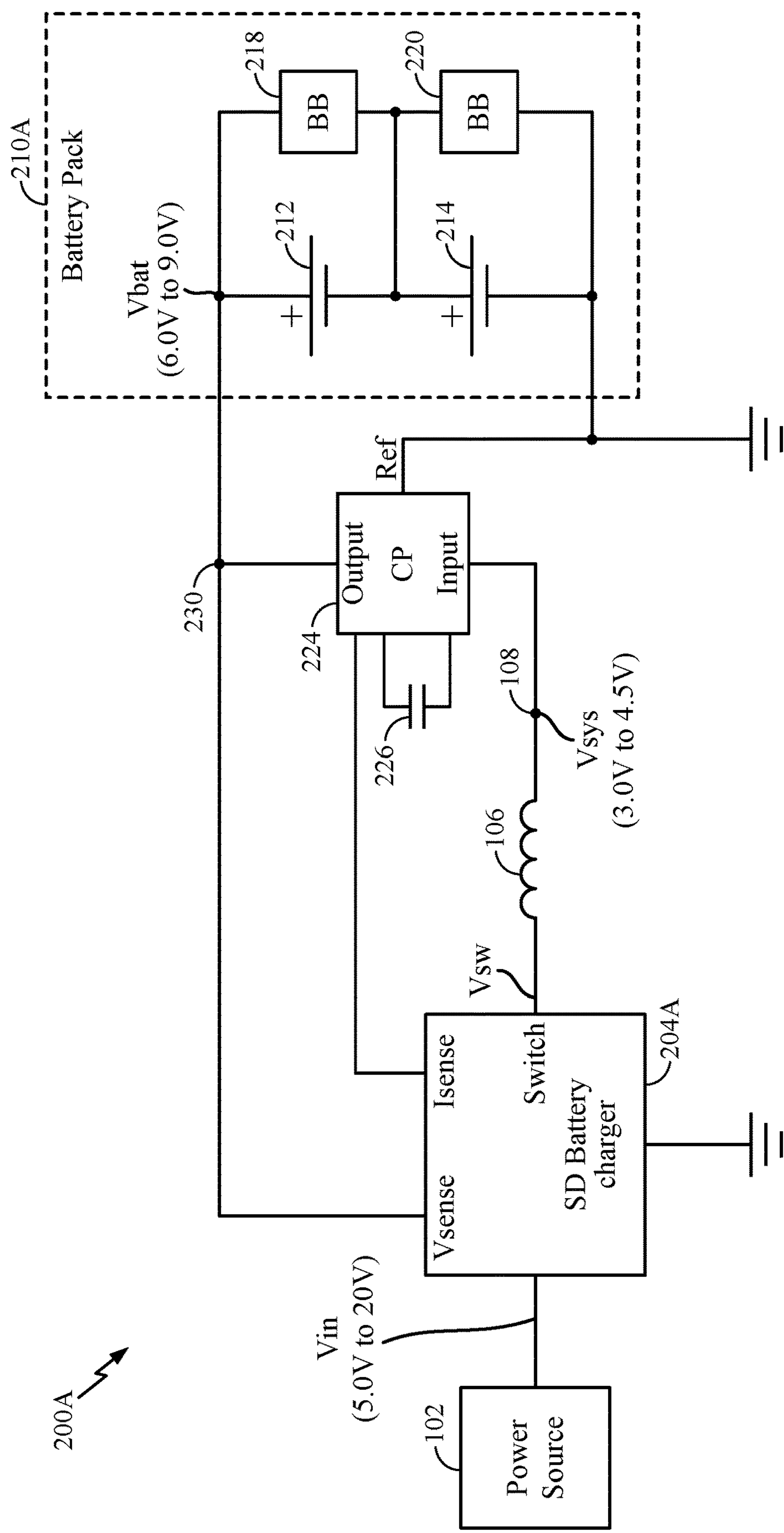
FIG. 2A is a block diagram illustrating an example circuit having a charge-pump and a step-up battery charger for charging a balanced double-stack battery pack, in accordance with certain aspects of the present disclosure.

FIG. 2A is a block diagram illustrating an example circuit 200A having a charge pump (CP) and a battery charger for charging a balanced double-stack battery pack, in accordance with certain aspects of the present disclosure. The circuit 200A includes a battery charger 204A (e.g., an SD battery charger) having both a voltage sense (Vsense) input and a current sense (Isense) input, as described in more detail herein. The circuit 200A also includes charge pump circuitry CP 224 that is coupled to a capacitive element 226, and a battery pack 210A. The battery pack 210A, also referred to as a double-stack battery pack, includes two batteries 212, 214 (also referred to as "battery cells") and two battery balancers (BBs) 218, 220.

As illustrated, an output of the CP 224 connects to the Vsense input of the battery charger 204 and a positive terminal of battery 212. A negative terminal of battery 212 connects to a positive terminal of battery 214. A negative terminal of battery 214 is connected to the reference potential node (e.g., electric ground). As illustrated, each of the batteries 212 and 214 may be coupled in parallel with a BB 218, 220, respectively, for balancing the voltage across the batteries 212 and 214 as described in more detail herein.

Battery pack 210A may be any type of "double-stack battery pack" configured to store any voltage (Vbat), such as any voltage within an inclusive range of 6.0V-10% (5.4V) to 9.0V+10% (9.9V). In some implementations, battery pack 210A may be any energy storage device capable of storing any voltage.

In certain aspects, the battery charger 204A senses the battery voltage Vbat of battery pack 210A at any time, including for example, continuously or at any time interval equal to or between 1 microsecond and 5 seconds. While monitoring Vbat, the battery charger 204A generates and maintains a system voltage Vsys at the system node 108 that is one-half (referred to as the "fractional amount"), or substantially one-half, the battery voltage Vbat of the battery pack 210A. The CP 224 then generates the voltage at node 230 to charge the battery pack 210A. For example, the CP 224 may be configured to generate a voltage at the output node of the CP 224 (e.g., coupled to node 230) that is double the voltage at the input node of the CP 224 (e.g., coupled to system node 108). For example, the battery charger 204A may receive an 8V input voltage Vin, while sensing that battery voltage Vbat is 6.0V. In response to the battery charger 204A calculates (or determines) a 3V target voltage for the system node 108 by dividing the sensed battery voltage Vbat (e.g., 6V) by 2 (i.e., the fractional amount). Second, battery charger 204A calculates (or determines) a 5V reduction factor by subtracting the 3V target voltage from the 8V input voltage Vin. The battery charger 204A then generates the 3V target voltage at system node 108 by decreasing the input voltage Vin by the calculated 5V reduction factor. The CP 224 then generates the voltage at node 230 (e.g., 6V) for charging the battery pack 210A.

In certain aspects, the battery charger 204A generates and maintains a system voltage Vsys at the system node 108 that is any fractional (or proportional) amount of the battery voltage Vbat, including for example, any fractional amount equal to ½, ⅓, ¼, ⅕, ⅙, and ⅐. For example, battery charger 204A may be adapted to generate an output voltage that is ⅓ the battery voltage Vbat, instead of the ½ described above. In this configuration, the battery charger 204A may receive an input voltage of 15V and sense a Vbat of 12.0V. In response, battery charger 204A calculates a 4V target voltage to be applied to the system node 108 by dividing the sensed battery voltage Vbat (e.g., 12V) by 3 (i.e., the fractional amount). Battery charger 204A also calculates an 11V reduction factor by subtracting the 4V target voltage from the 15V input voltage. Battery charger 204A then generates the 4V target voltage at system node 108 by decreasing the input voltage Vin by the 11V reduction factor. The battery charger 204A may be configured to use a lower fractional amount for each additional CP (e.g., CP 224) added to the circuit, as will be described in more detail herein. For example, if the circuit uses two CPs then the fractional amount of a battery charger may be set at ⅓. As another example, if the circuit uses three CPs then the fractional amount of a battery charger may be set at ¼.

In certain aspects, the fractional amount may be a fixed value, a variable value, or a programmable value. For example, a processor (e.g., a modem) or microcontroller may first set the fractional amount to ½, causing the battery charger 204A to generate a voltage (Vsys) at system node 208A equal to the 3V target voltage, as described in the previous example.

In certain aspects, a processor or microcontroller may program the fractional amount in response to the occurrence of a triggering event, such as, the power-up of circuit 200A, the elapse of a predetermined amount of time (e.g., any time value equal to or between 1 picosecond and 5 seconds) after the power-up of circuit 200A, a change in the input voltage beyond a predetermined threshold, a change in the battery voltage Vbat beyond a predetermined threshold.

In certain aspects, the battery charger 204A may transfer (or deliver) the input voltage Vin to the system node 108 bypassing internal circuity of the battery charger 204A. That is, when the battery charger 204A is in a bypass mode, the battery charger 204A generates an output voltage that matches the received input voltage. For example, external circuitry (e.g., a modem, processor, microcontroller, or a PMIC) may toggle a bypass pin (not shown) associated with battery charger 204A to configure the battery charger 204A into the bypass mode, and in response, the battery charger 204A may generate, for instance, a 4V output voltage upon receiving a 4V input voltage.

In certain aspects, the battery charger 204A may continuously adjust the voltage at the system node 108 based on fluctuations of the input voltage Vin and/or the sensed battery voltage Vbat. For example, the input voltage Vin received by the battery charger 204A may change from a first input voltage of 7V to a second input voltage of 20V. The battery charger 204A may also sense (via its sense input) that the voltage of the battery pack 210A changes from a first battery voltage Vbat of 6V to a second battery voltage Vbat of 8V. In response, the battery charger 204A may calculate a new target voltage (e.g., 4V) by dividing the second battery voltage Vbat (e.g., 8V) by the fractional amount of 2. The battery charger 204A then calculates a new reduction factor (e.g., 16V) for the second input voltage by subtracting the new target voltage (e.g., 4V) from the second input voltage (e.g., 20V). Battery charger 204A then generates the new target voltage (e.g., 4V) at system node 208A by decreasing the second input voltage Vin by the new reduction factor (e.g., 16V).

In certain aspects, the battery charger 204A may adjust the voltage of the system node 108 based on the temperature of the battery pack 210A. The battery charger 204A may include a thermocouple connection (not shown) to the battery pack 210A that indicates the battery pack's temperature information to the battery charger 204A. In response to an increase in temperature beyond a temperature threshold, the battery charger 204A may decrease the voltage at the system node 108 by a certain percentage in order to protect the battery pack 210A from any damage caused by the excessive heat. For example, the battery charger 204A may calculate a target voltage of 3V to be applied to the system node 208A based on a particular input voltage Vin and Vbat. However, the battery charger 204A may sense via the thermocouple, that the temperature of battery pack 210A has exceeded a temperature threshold (e.g., 80° C.). To protect the battery pack 210A, the battery charger 204A may generate an output voltage at the system node 108 of 2.7V, which may be 10% less than the originally calculated target voltage of 3V. If the battery pack's temperature falls below the predetermined temperature of 80° C., then battery charger 204 may generate the originally calculated target voltage of 3V at the system node 108. A predetermined percentage may be any percentage, for example, any percentage equal to or between 1% and 100%. A temperature threshold may be any temperature, for example, any temperature equal to or between 0° C. and 200° C. In certain aspects, the battery charger 204A may limit the amount of current being sourced to the battery pack 210 to a predetermined current limit in order to protect battery pack 210A from any damage caused by excessive heat.

CP 224 may operate in an open-loop configuration to generate an output voltage at the output terminal of the CP 224 that is double, or substantially double, the input voltage the CP 224 receives from the battery charger 204A. CP 224 may generate any voltage to charge the battery pack 210A, such as any voltage within an inclusive range of 6.0V-10% (5.4V) to 9.0V+10% (9.9V).

CP 224 charges the battery pack 210 in a two-cycle process. During the first time period, CP 224 configures internal connections (not shown in FIG. 2A) of the CP 224 to electrically connect the capacitive element 226 between CP's input terminal and the reference terminal (Ref) of the CP 224. Thus, during the first time period, the CP 224 charges the capacitive element 226 to a voltage equal to a difference between the voltage at the input terminal of the CP 224 and the voltage at the reference terminal of the CP 224. During a second time period, the CP 224 re-configures the internal connections to electrically connect capacitive element 226 in series between the input terminal of the CP 224 and the output of the CP 224. Thus, during the second time period, the sum of the voltage across the capacitive element 226 to which the capacitive element 226 was charged during the first time period and the voltage at the input terminal of the CP 224 is provided to the output terminal of the CP 224. In this manner, the CP 224 generates a voltage at node 230 that is greater than (e.g., double) the voltage at the input terminal of the CP 224.

For example, the CP 224 may receive a 3V input voltage from the battery charger 204A. In response, CP 224 subtracts the voltage at the reference terminal (e.g., 0V or electric ground) of the CP 224 from the voltage on at the input terminal (e.g., 3V) of the CP 224, providing a delta voltage of 3V. CP 224 then adds the delta voltage of 3V to the input voltage of 3V to generate an output voltage of 6V. As previously described, the output voltage of the CP 224 may also be fed back to the Vsense input of the battery charger 204, which the battery charger 204 uses to repeat the process of generating an output voltage for powering the downstream components (e.g., CPs, battery packs).

In certain aspects, the CP 224 may include a current sense transistor for sensing the amount of current being provided to the battery pack 210A. For example, instead of the current sense transistor (e.g., transistor 130) being implemented as part of the battery charger 204A (e.g., as described with respect to battery charger 104 in FIG. 1B), the current sense transistor may be implemented in the CP 224. The CP 224 detects the charging current being provided to the node 230 and to the battery pack 210A, and indicates (e.g., via a voltage) the current to the battery charger 204A via the connection to the Isense input of the battery charger 204A, as illustrated. The battery charger 204A may adjust the voltage generated at the system node 108 to regulate the charging current.

CP 224 may charge the battery pack 210 until the battery pack 210 is fully charged, at which point, the battery charger 204 may disable the output voltage at the system node 108, power down the CP 224, and stop the charging of battery pack 210. In certain aspects, the charging process continues even after the battery pack 210 is fully charged. In certain aspects, CP 224 may be any type of circuit that generates a higher output voltage from a lower input voltage, including for example, a voltage doubler rectifier (e.g., Villard circuit, a Greinacher circuit, a Bridge circuit, a Delon circuit using full-wave voltage doubler topology), a switched capacitor (e.g., a Dickson CP or Dickson multiplier, cross-coupled switched capacitors), a boost converter (step-up converter), etc.

Stacked batteries (e.g., batteries 212, 214) may charge at different rates and/or to different maximum voltages due to differences in aging characteristics, battery size and/or inherent characteristics, and uneven temperature distribution within the battery pack. As a result, one battery could reach full charge before other batteries in the battery pack have reached their full charge. This could subject the fully-charged battery to an overcharging condition, while charging the rest of the batteries to their full charge. Overcharging a battery can cause the battery to prematurely fail.

Battery balancers (BB) 218, 220 protect a battery from overcharge by maintaining an equal voltage across the batteries (or cells) of a battery pack during the charging cycle. This technique increases the life of the stacked batteries.

Figure 2B:
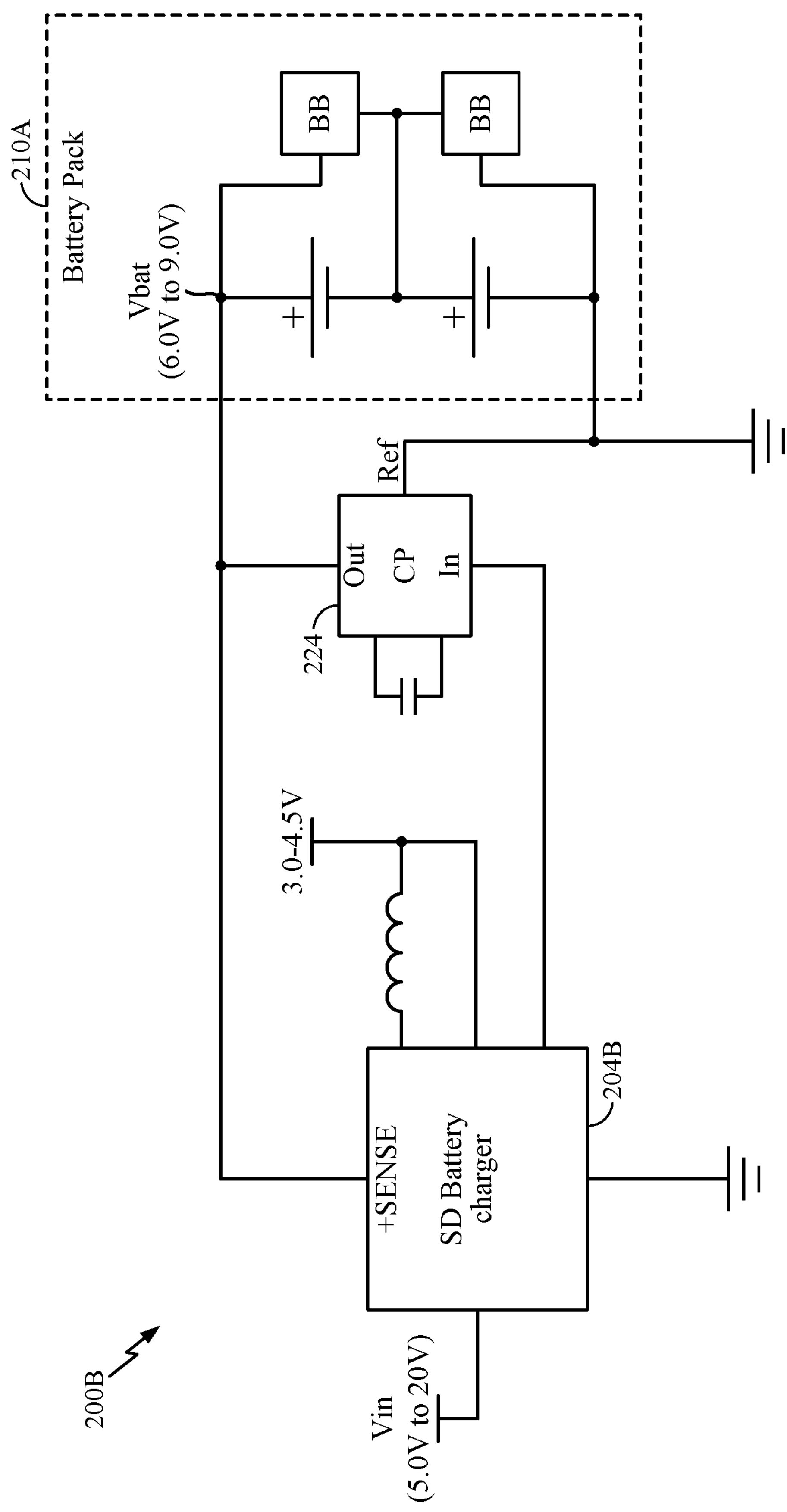
FIG. 2B is a block diagram illustrating an example circuit for charging a balanced double-stack battery pack implemented with a charge pump and a step-up battery charger having a current sense transistor, in accordance with certain aspects of the present disclosure.

FIG. 2B is a block diagram illustrating a circuit 200B having a CP and a step-up battery charger having an internal current sensing transistor, in accordance with an illustrative implementation. The circuit 200B is similar to the circuit 200A, but with the battery charger implemented with an interval current sensing transistor, as described with respect to the battery charger 104B of FIG. 1B. The internal current sense transistor of the battery charger 204B senses the amount of current provided to system node 108, and may regulate the output current of the battery charger 204B accordingly, as previously described.

Balanced Charging an Unbalanced Double-Stack Battery Pack

Figure 2C:
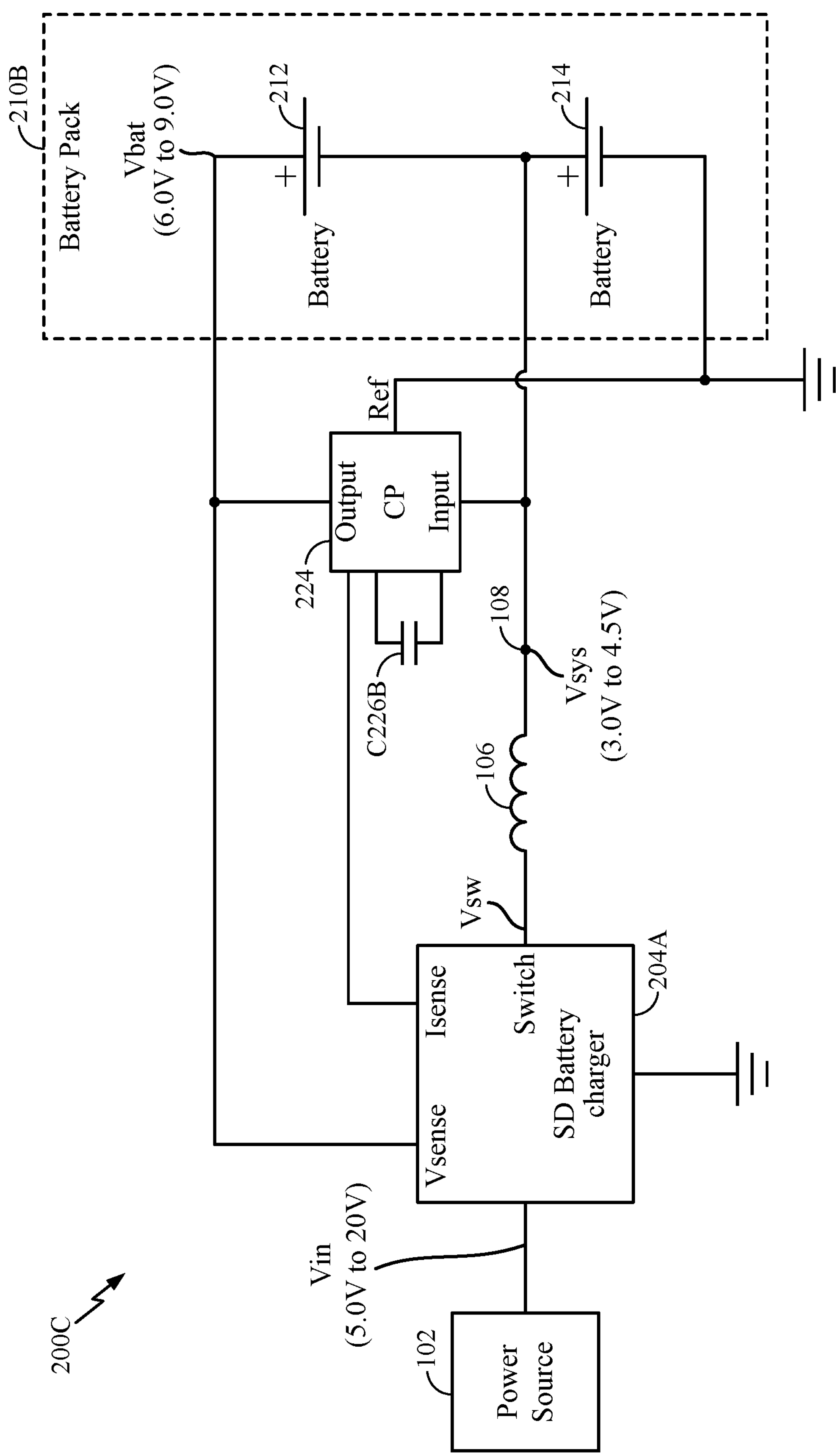
FIG. 2C is a block diagram illustrating an example circuit having a charge-pump and a step-up battery charger for balanced charging of an unbalanced double-stack battery pack, in accordance with certain aspects of the present disclosure.

FIG. 2C is a block diagram illustrating an example circuit 200C having a charge-pump and a step-up battery charger for balanced charging of an unbalanced double-stack battery pack, in accordance with an illustrative implementation. In this case, the battery pack 210B, also referred to as a double-stack battery pack, includes two batteries 212, 214, but does not include internal battery balancers (e.g., BB 218, 220).

In certain aspects, the CP 224 may protect the batteries 212, 214 from overcharge by maintaining an equal voltage across the batteries of the battery pack 210B during the charging cycle. For example, the battery charger 204A may provide a 3V output voltage to both the input of CP 224 and the positive terminal of the battery 214. The CP 224 generates a 6V output voltage to charge battery 212 using any of the methods described herein. Since the voltage across battery 212 is 3V and the voltage across the battery 214 is also 3V, the voltage across the batteries 212 and 214 may be balanced. As such, the CP 224 effectively balances the charging of batteries 212, 214.

Charging a Balanced Triple-Stack Battery Pack

Figure 3A:
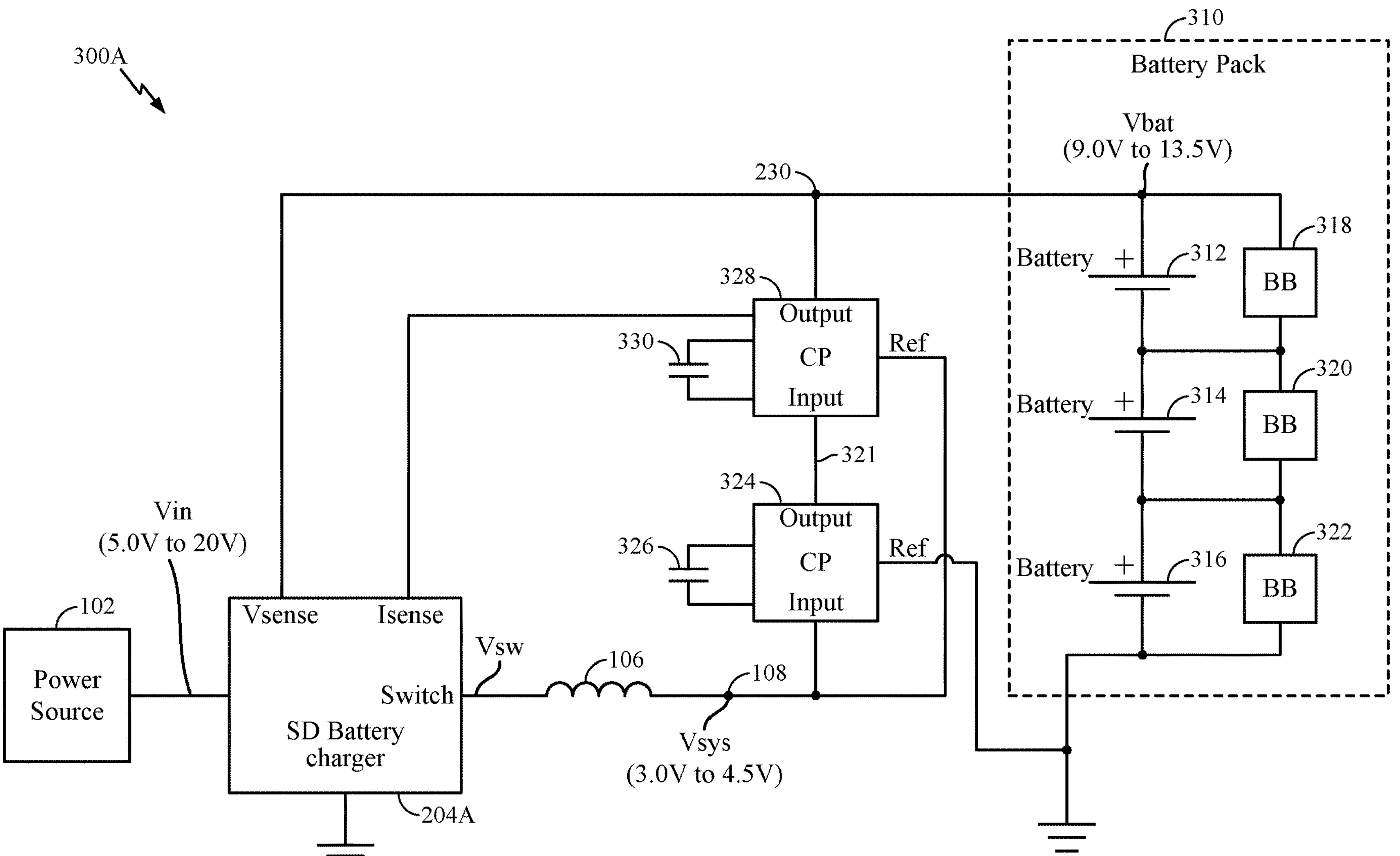
FIG. 3A is a block diagram illustrating an example circuit having a charge pump and a step-up battery charger for charging a balanced triple-stack battery pack, in accordance with certain aspects of the present disclosure.

FIG. 3A is a block diagram illustrating an example circuit 300A having a CP and a step-up battery charger for charging a balanced triple-stack battery pack, in accordance with certain aspects of the present disclosure. The circuit 300A includes two CPs (shown in FIG. 3A as CP 324 and CP 328) each coupled to a capacitive element 326 and 330. The battery pack 310, also referred to as a triple-stack battery pack, includes three batteries 312, 314, 316 and three BBs 318, BB 320, and BB 322.

In certain aspects, one CP is added for each additional battery (e.g., triple-stacked batteries may be implemented with two CPs, quad-stacked batteries may be implemented with three CPs, etc.). BBs 318, 320, 322 contain similar functionality as BBs 218, 220, in FIG. 2A. Although not shown, CPs 324, 328 may be housed inside the battery pack 310. While monitoring the battery voltage Vbat, battery charger 204A generates and maintains a system voltage (Vsys) at system node 108 and the reference terminal of CP 328. The system voltage Vsys may be one-third (referred to as the "fractional amount"), or substantially one-third, the battery voltage (Vbat) of battery pack 310A. For example, the battery charger 204A may receive a 20V input voltage Vin from power source 102, while sensing that battery voltage Vbat is currently 12.0V. Thus, the battery charger 304A may generate a 3V output voltage at the input terminal of CP 324 and the reference terminal of CP 328.

As shown in FIG. 3A, CPs 324, 328 (similar to CP 224 in FIG. 2A) are arranged to charge batteries 312, 314, and 316 of the battery pack 310 by generating a higher output voltage from a lower input voltage. Although CPs 324, 328 may be similar components, each operating in an open-loop configuration, their specific placement in circuit 300A may cause them to have different output voltage to input voltage behavior. That is, CP 324 generates an output voltage (referred to as an "intermediate voltage") at node 321 that is double, or substantially double, the input voltage at the system node 108. Conversely, CP 328 generates an output voltage at node 230 based on the following equation:

$$Vout_{CP328}=Vin_{CP328}+(Vin_{CP328}-Vref_{CP328}) \quad (1)$$

where $Vout_{CP328}$ is the output voltage of CP 328, $Vin_{CP328}$ is the input voltage of CP 328, and $Vref_{CP328}$ is the voltage at the reference terminal of the CP 328. Since the reference terminal for CP 328 is connected to the output of the battery charger 204A, the output voltage generated by CP 328 is represented by equation (1), described above. For example, CP 324 may receive a 3V input voltage from the battery charger 204A. In response, CP 324 doubles the voltage at the system node 108 to generate a 6V output voltage at node 321. In turn, CP 328 subtracts its 3V reference voltage at the reference terminal of the CP 328 from the 6V input at node 321. CP 328 then adds the 3V delta voltage to the 6V input voltage at node 321 to generate a 9V output voltage to charge battery pack 310.

In certain aspects, the CP 324 may generate an output voltage at node 321 based on the following equation:

$$Vout_{CP324}=Vin_{CP324}+(Vin_{CP324}-Vref_{CP324}) \quad (2)$$

where $Vout_{CP324A}$ is the output voltage of CP 324, $Vin_{CP324}$ is the input voltage of the CP 324, and $Vref_{CP324}$ is the voltage at the reference terminal of CP 324. As illustrated, each of the batteries 312, 314, and 316 are coupled in parallel with a BB 318, 320, and 322 for voltage balancing.

Balanced Charging an Unbalanced Triple-Stack Battery Pack

Figure 3B:
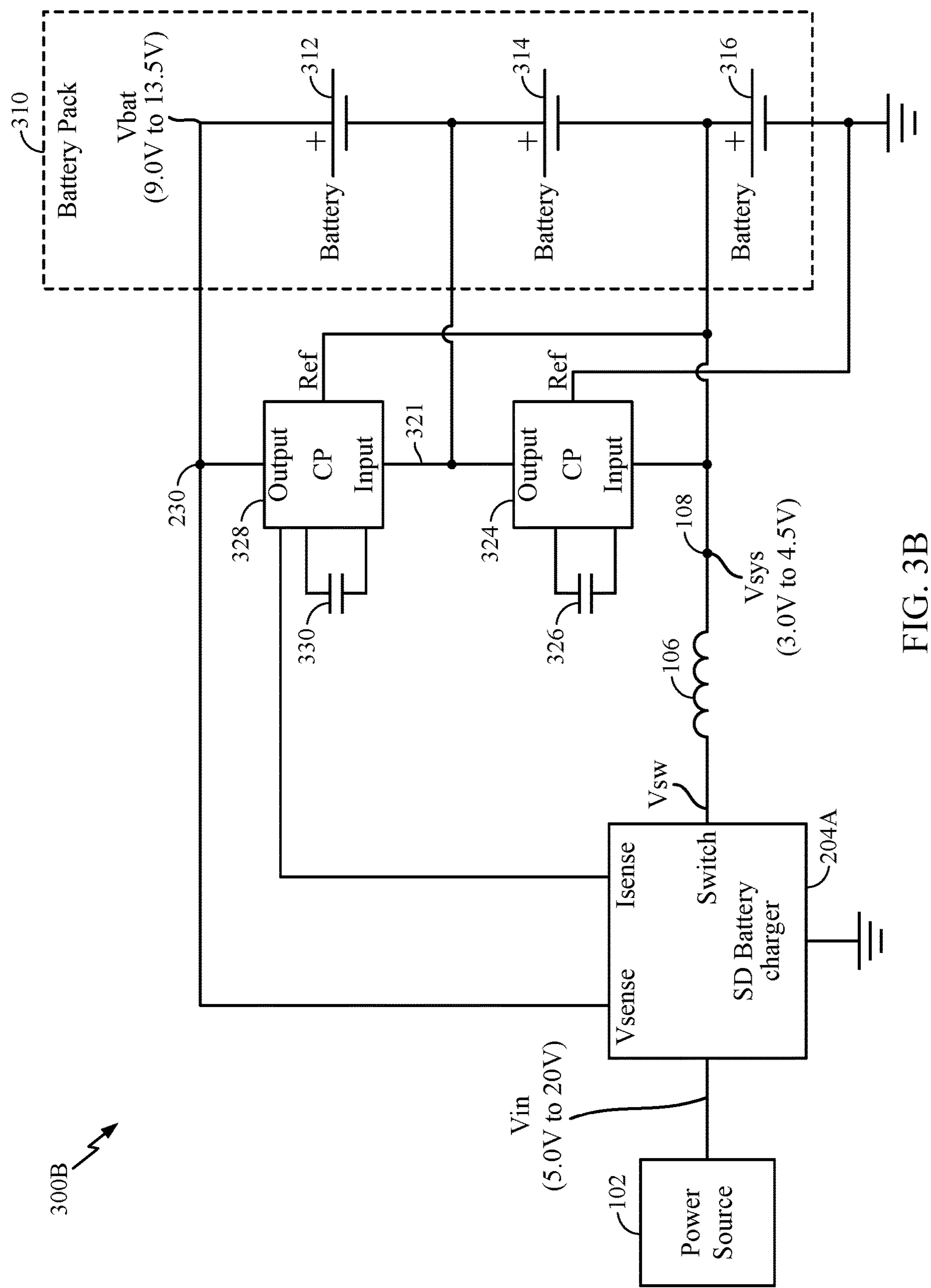
FIG. 3B is a block diagram illustrating an example circuit having a charge pump and a step-up battery charger for balanced charging of an unbalanced triple-stack battery pack, in accordance with certain aspects of the present disclosure.

FIG. 3B is a block diagram illustrating an example circuit 300B having a CP and a step-up battery charger for balanced charging of a triple-stack battery pack, in accordance with certain aspects of the present disclosure. Battery pack 310B, also referred to as a triple-stack battery pack, includes three batteries 312, 314, 316, but does not include BBs.

CPs 324, 328 protect batteries 312, 314, 316 from overcharge by maintaining an equal voltage across each of the batteries 312, 314, 316 during the charging cycle. For example, the battery charger 204A may provide a 3V output voltage to the input of CP 324, the reference terminal of CP 328, and the positive terminal of battery 314. Thus, the voltage across battery 316 is 3V during the charging cycle. CP 324 generates a 6V output voltage at node 321, as previously described, by doubling the voltage at the system node 108. The CP 328 then generates a 9V charging signal at node 230. In other words, the reference terminal of the CP 328 is coupled to the system node 108 (e.g., 3V), and since the voltage at node 321 at the input terminal of the CP 328 is at 6V, the CP 328 generates a 9V signal at node 230. Since the voltage across battery 312 is 3V (e.g., positive terminal=9V, negative terminal=6V), the voltage across battery 314B is 3V (e.g., positive terminal=6V, negative terminal=3V), and the voltage across battery 316 is 3V (e.g., positive terminal=3V, negative terminal=0V), an equal voltage is generated across each of the batteries 312, 314, and 316, effectively balancing the charging of the batteries.

Figure 3C:
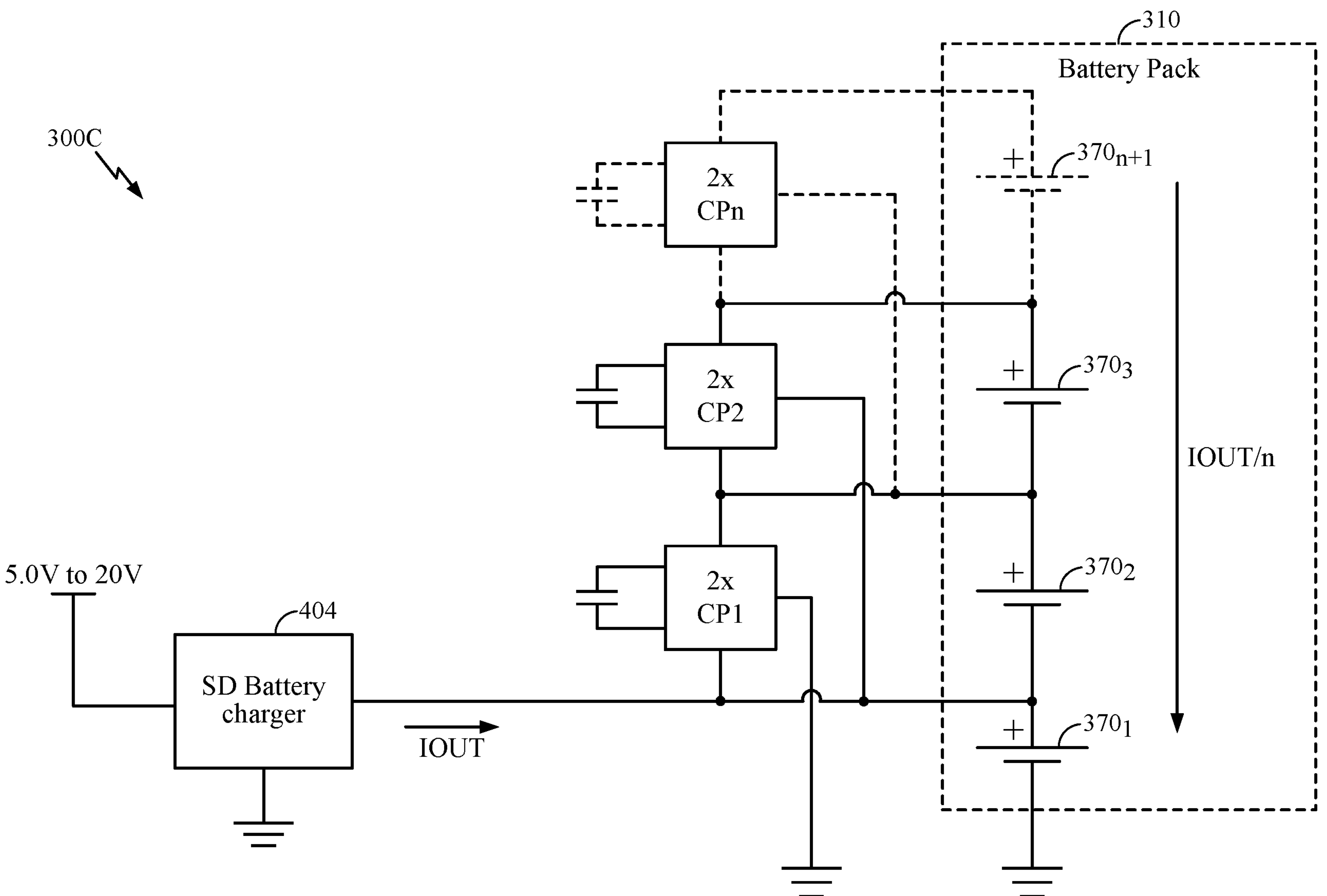
FIG. 3C is a block diagram illustrating an example circuit having a charge pump and a step-up battery charger for balanced charging of an unbalanced battery pack having multiple battery cells, in accordance with certain aspects of the present disclosure.

FIG. 3C is a block diagram illustrating an example circuit 300C having a CP and a step-up battery charger for balanced charging of a triple-stack battery pack, in accordance with certain aspects of the present disclosure. As illustrated, the circuit 300C may be implemented with any number of CPs (e.g., CP1 to CPn) for charging a battery pack having any number of batteries (e.g., batteries $\mathbf{370}_1$ to $\mathbf{370}_{n+1}$). Each of the CPs CP1 to CPn may be coupled in parallel with one of the batteries of the battery pack. The charge current flowing across the batteries of the battery pack may be about Iout/n, where Iout is the output current of the battery charger 404 and n is the number of CPs of the circuit 300C.

CP Doubler with a Step-Up/Step-Down Battery Charger

Figure 4A:
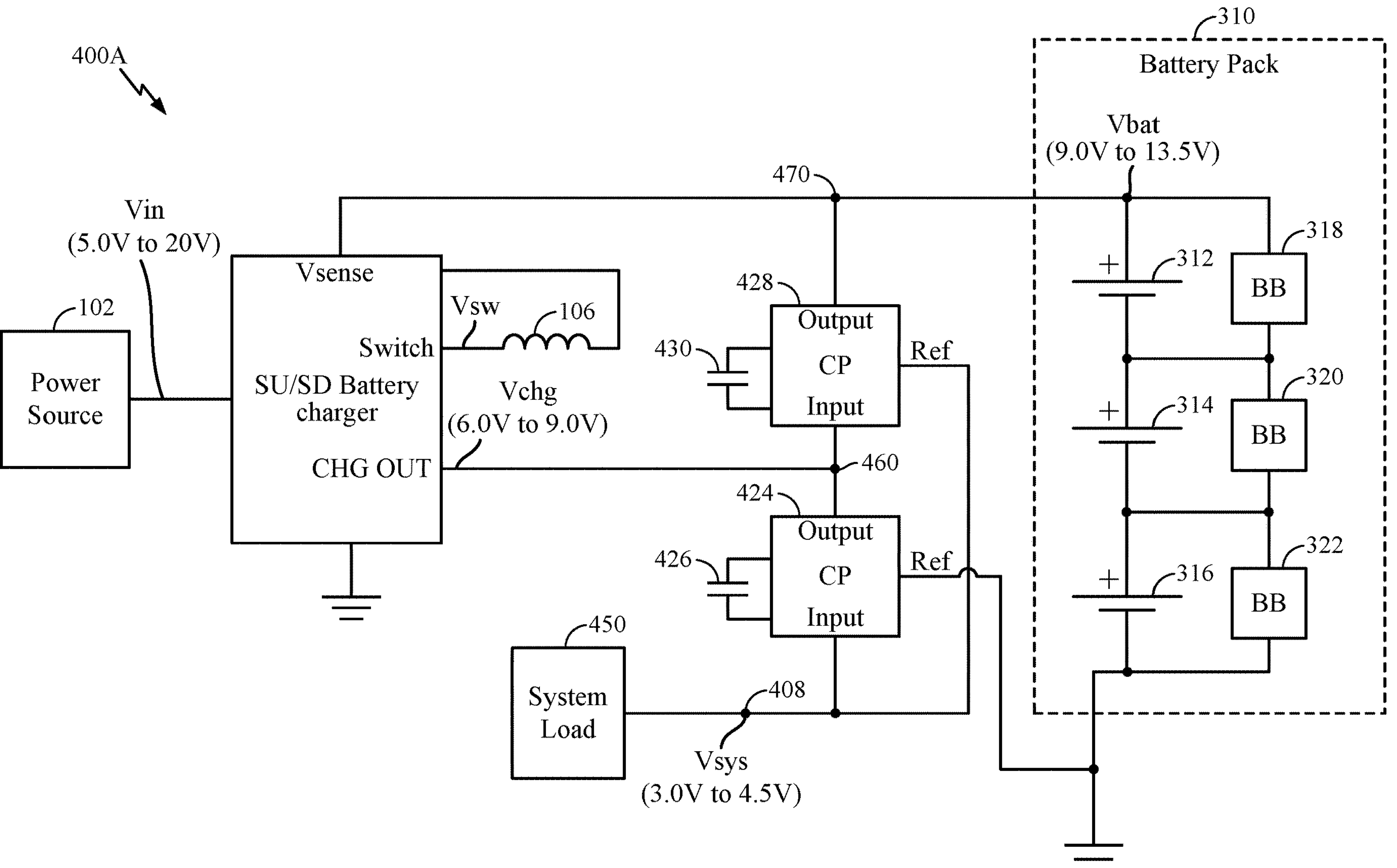
FIG. 4A is a block diagram illustrating an example circuit having a charge pump and a step-up/step-down battery charger for charging a balanced triple-stack battery pack, in accordance with certain aspects of the present disclosure.

FIG. 4A is a block diagram illustrating a circuit 400A having a CP and a step-up (SU)/step-down (SD) battery charger for charging a balanced triple-stack battery pack, in accordance with certain aspects of the present disclosure. The battery charger 404 may be implemented as a buck-boost switch mode converter (also referred to as a buck-boost switch-mode regulator). The circuit 400A includes two charge-pumps 424, 428, each coupled to a capacitive element 426 and 430 respectively.

The battery charger 404 is similar to the battery charger 204B described with respect to FIG. 2C in that the battery charger 404 includes an internal current sense transistor (not shown), allowing the battery charger 404 to determine the amount of current being sourced to node 460. Node 460 may be connected to the input terminal of CP 424 and to the input terminal of CP 428. The CP 424 may be configured as a SD CP configured to generate a system voltage at the system node 408 that is less than (e.g., is half of) the voltage at node 460. The system node 408 may be coupled to a system load 450, representing a load from one or more components of an electronic device having the circuit 400A. In other words, the system voltage at the system node 408 may be used to provide power to one or more other components of the electronic device. In certain aspects, the system node 408 may be coupled to the output terminal of CP 424, and to the reference terminal of CP 428. Thus, the CP 428 generates a voltage at node 470 that is greater than (e.g., is double) the voltage at node 460 in order to charge the battery pack 310. In certain aspects, an output of CP 428 may be connected to a Vsense input of battery charger 404.

The battery charger 404 may be any type of circuit or instrument that generates a voltage that is either greater than or less than input voltage Vin of the battery charger 404. Thus, the battery charger 404 is able to generate a voltage at node 460 that matches a target voltage (e.g., 6V), regardless of whether the input voltage Vin is greater than or less than the target voltage.

Figure 4B:
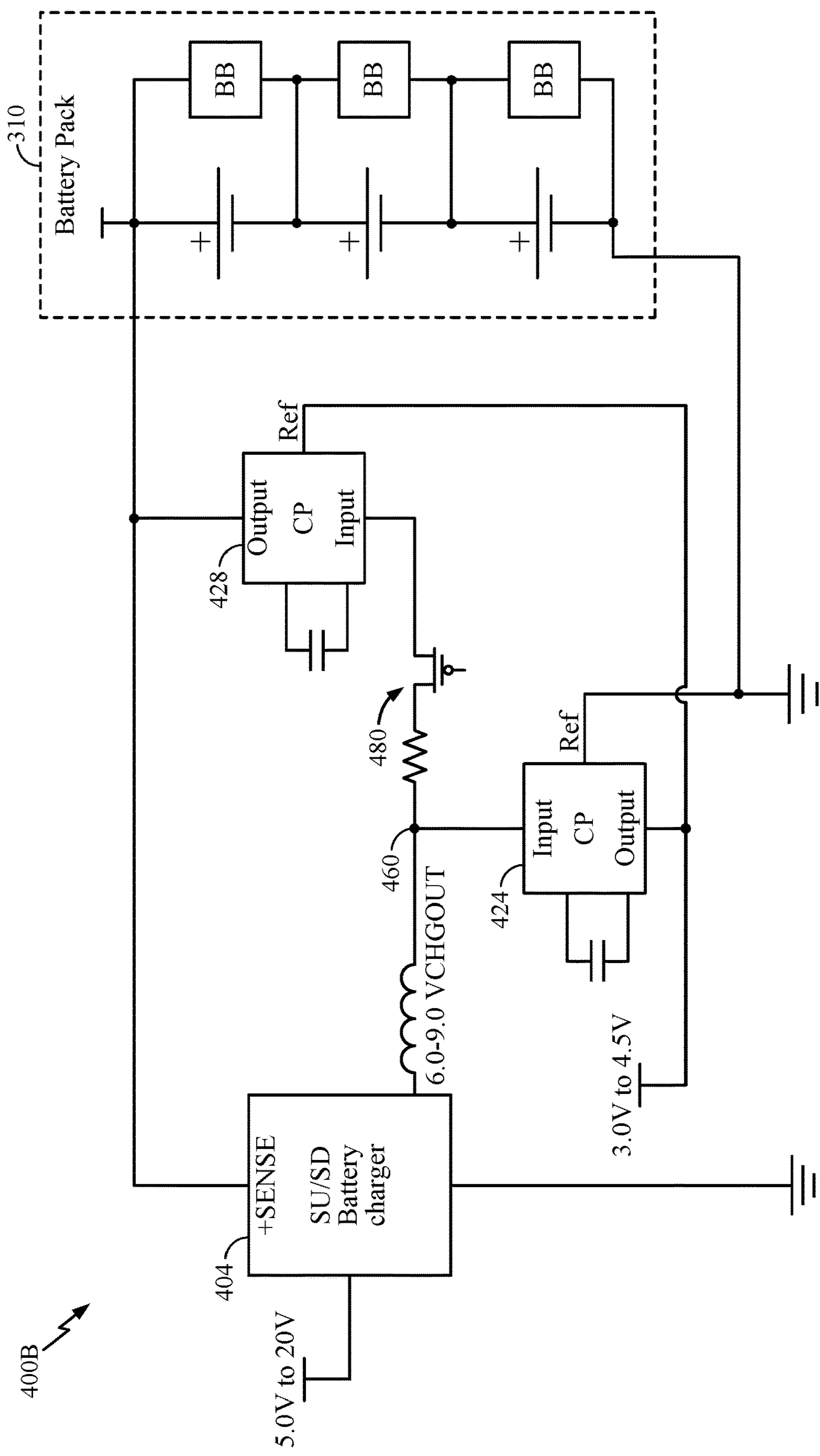
FIG. 4B is a block diagram illustrating an example circuit having a charge pump and a step-up/step-down battery charger for charging a balanced triple-stack battery pack and having an external current sense transistor, in accordance with certain aspects of the present disclosure.

FIG. 4B is a block diagram illustrating an example circuit 400B having a CP and a SU/SD battery charger for charging a balanced triple-stack battery pack and implemented with an external current sense transistor 480, in accordance with certain aspects of the present disclosure. As illustrated, the circuit 400B may include an external transistor 480 (e.g., switch) for current sensing. The voltage between the drain and source of the transistor 480 may be detected to detect the amount of current being sourced to the CP 428, and thus, being used to charge the battery pack 310. The detected amount of current may be used to regulate the charging current provided to the battery pack 310 by controlling the gate of the transistor 480.

Figure 4C:
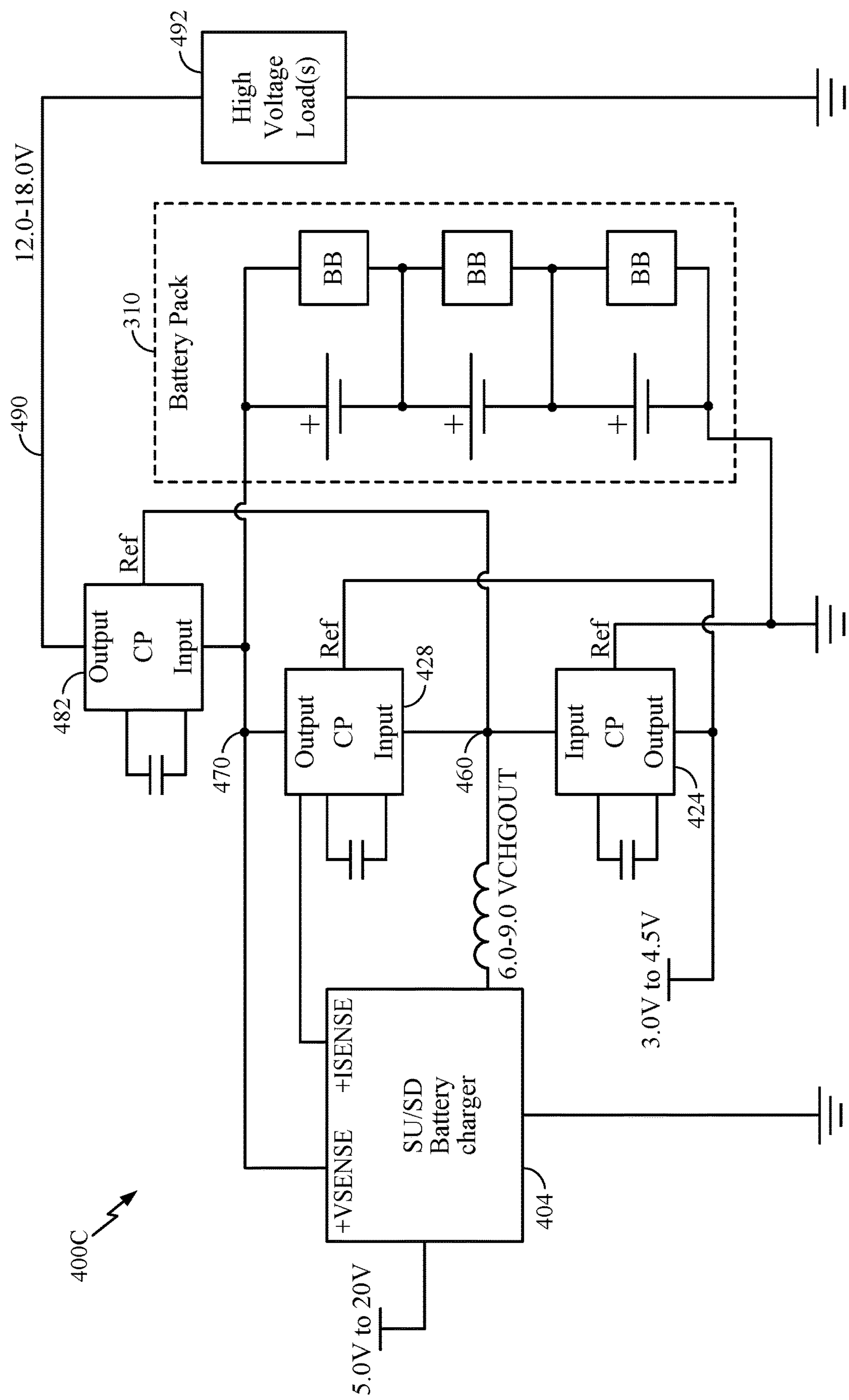
FIG. 4C is a block diagram illustrating an example circuit having a step-up/step-down battery charger for charging a balanced triple-stack battery pack and having a charge pump for generating a high-voltage signal, in accordance with certain aspects of the present disclosure.

FIG. 4C is a block diagram illustrating an example circuit 400C having CP and a SU/SD battery charger for charging a balanced triple-stack battery pack and having a CP for generating a high-voltage signal, in accordance with certain aspects of the present disclosure. As illustrated, the node 460 is coupled to the input terminal of the CPs 428 and 424. The CP 428 may include an internal current sense transistor to sense the current being supplied by the CP 428. The sensed current is indicated to the battery charger 404 via the Isense input of the battery charger 404, as illustrated. In certain aspects, the circuit 400C also includes a CP 482 which may generate a high-voltage signal at node 490 (also referred to as a "high-voltage supply node") to be provided to a high-voltage load 492. For example, certain components of electronic devices, such as a flash of a mobile device, may operate from a high-voltage signal. The CP 482 may be implemented to generate the high-voltage signal for such components. The reference terminal of the CP 482 may be coupled to node 460. Thus, when node 460 is at 6V and node 470 is at 9V, the CP 482 generates a voltage at node 490 that is 12V, which may be provided to the high-voltage load 492, as illustrated.

A battery, as described herein, may be charged and recharged by applying an electric current to reverse the chemical reactions that occur during discharge and/or use. A battery may be any type of rechargeable battery, including, in a non-limiting example, a lead-acid battery, a valve regulated lead-acid battery (VRLA battery), a nickel-cadmium (NiCd) battery, a nickel-zinc (NiZn) battery, a nickel metal hydride (NiMH) battery, and a lithium-ion (Li-ion) battery, lithium-sulfur battery, and lithium iron phosphate ($LiFePO_4$) battery.

A capacitive element, as described herein is an energy storage element that stores electrical energy in an electric field. A capacitive element may be an electrolytic capacitor, an aluminum electrolytic capacitor, a tantalum electrolytic capacitor, a super capacitor, a variable capacitor, a trimmer capacitor, a ceramic capacitor, a power film capacitor, polypropylene capacitor, a polycarbonate capacitor, a silver mica capacitor, an integrated-circuit (IC) capacitor, a super-capacitor, a double-layer capacitor, a pseudo-capacitor, or hybrid, capacitors. In some implementations, other energy storage elements may be used in place of or in addition to a capacitor, such as, a rechargeable battery, a superconducting magnetic energy storage (SMES), or any other suitable energy storage element. In certain aspects, more than one capacitive element may be connected in parallel and have the same effect as a single capacitive element.

An inductive element, as described herein, is an energy storage element that stores electrical energy in a magnetic field when electric current flows across the inductive element. An inductive element may be an air core inductor, a coil, a reactor, a wire, a radio frequency inductor, a ferromagnetic core inductor, a laminated core inductor, a ferrite-core inductor, a toroidal core inductor, or a variable inductor. In certain aspects, more than one inductive element may be connected in series and have the same effect as a single inductive element.

Figure 5:
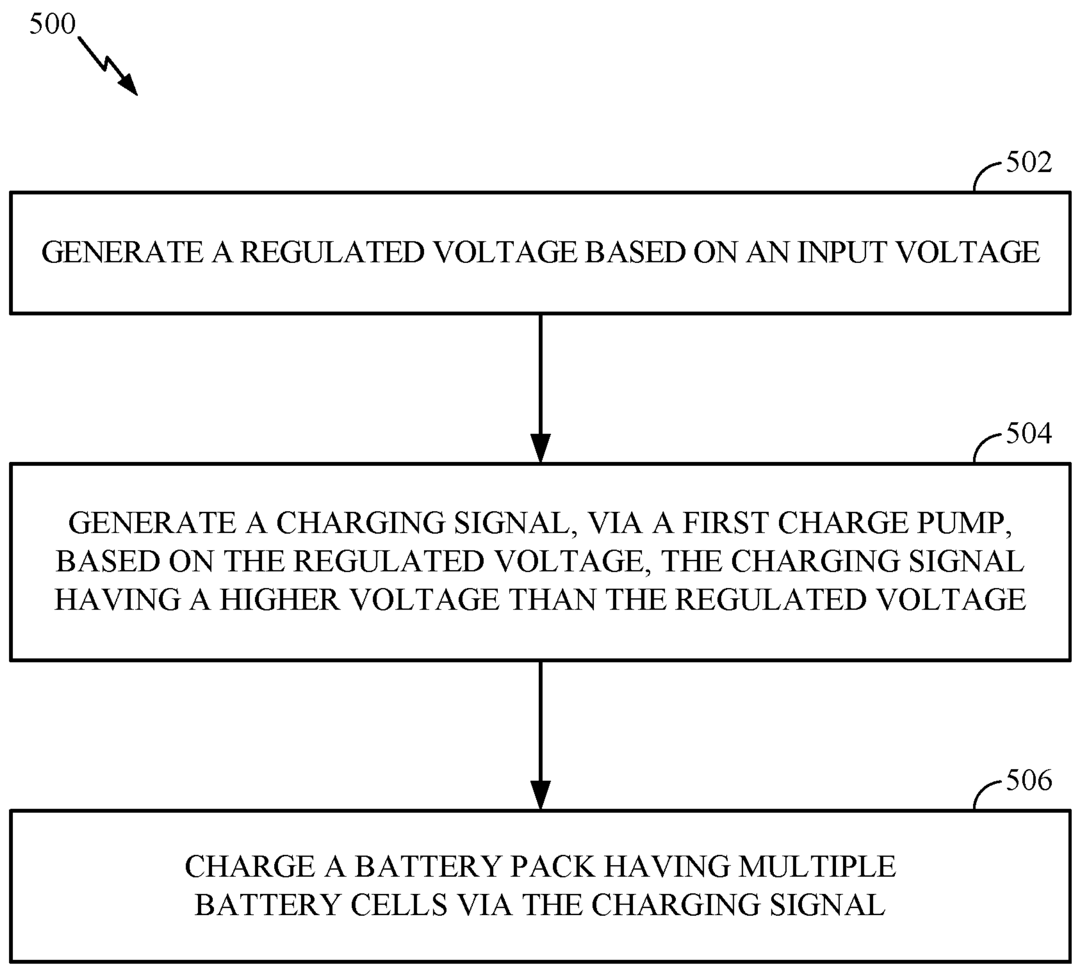
FIG. 5 is a flow diagram illustrating example operations for charging a battery pack, in accordance with certain aspects of the present disclosure.

FIG. 5 is a flow diagram illustrating example operations 500 for charging a battery pack, in accordance with certain aspects of the present disclosure. The operations 500 may be performed by a circuit, such as the circuits described with respect to FIGS. 2A, 2B, 2C, 3A, 3B, 3C, 4A, 4B, and 4C.

The operations 500 begin, at block 502, by generating a regulated voltage based on an input voltage, and at block 504, by generating a charging signal, via a first CP (e.g., CP 224), based on the regulated voltage, the charging signal having a higher voltage than the regulated voltage. The operations 500 continue at block 506, by charging a battery pack having multiple battery cells via the charging signal.

In certain aspects, a reference terminal of the CP may be coupled to a terminal of a first battery cell (e.g., the negative terminal of battery 214) of the multiple battery cells, and the charging signal may be provided to a terminal of a second battery cell (e.g., the positive terminal of the battery 212) of the multiple battery cells, another terminal of the first battery cell (e.g., the positive terminal of the battery 214) may be coupled to another terminal of the second battery cell (e.g., the negative terminal of the battery 212). In certain aspects, the operations 500 also include determining an amount of current output from the CP (e.g., CP 224), where the regulated voltage is generated based on the amount of current.

In certain aspects, the operations 500 include generating, via a second CP (e.g., CP 324), an intermediary signal based on the regulated voltage, the intermediary signal having a higher voltage than the regulated voltage. In this case, the charging signal may be generated (e.g., via the CP 328) based on the intermediary signal. In certain aspects, a reference terminal of the second CP may be coupled to a first terminal of a first battery cell of the multiple battery cells. In this case, the regulated voltage may be provided to a second terminal of the first battery cell and to a first terminal of a second battery cell of the multiple battery cells, the intermediary signal may be provided to a first terminal of a third battery cell of the multiple battery cells and to a second terminal of the second battery cell, and the charging signal may be provided to a second terminal of the third battery cell.

In certain aspects, the operations 500 also include generating, via a second CP (e.g., CP 424), a system voltage having a lower voltage than the regulated voltage, where the reference terminal of the first CP (e.g., CP 428) is coupled to a node for providing the system voltage. In this case, the operations 500 may also include generating, via a third CP (e.g., CP 482), a high-voltage signal based on the charging signal and having a higher voltage than the charging voltage, where a reference terminal of the third CP is coupled to a node for providing the regulated voltage.

In certain aspects, generating the charging signal includes coupling a capacitive element (e.g., capacitive element 226) between a node for providing the regulated voltage and a reference terminal of the first CP during a first time period, and coupling the capacitive element between an input terminal of the first CP and an output terminal of the first CP during a second time period.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with discrete gate or transistor logic, discrete hardware components, or any combination thereof designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for charging a battery pack, the circuit comprising:
- a voltage regulator; and
- charge pump circuitry configured to generate a charging signal at an output of the charge pump circuitry, the charge pump circuitry having an input coupled to an output of the voltage regulator, and the output of the charge pump circuitry coupled to a first battery charging terminal, wherein the first battery charging terminal is configured to couple to a terminal of a first battery cell of the battery pack having multiple battery cells.

2. The circuit of claim 1, wherein:
- a reference terminal of the charge pump circuitry is coupled to a reference potential node of the circuit.

3. The circuit of claim 2, wherein:
- the input of the charge pump circuitry is coupled to a second battery charging terminal that is configured to couple to another terminal of the first battery cell and is configured to couple to a terminal of a second battery cell of the battery pack; and
- the reference potential node is coupled to the reference terminal of the charge pump circuitry and is configured to couple to another terminal of the second battery cell.

4. The circuit of claim 1, wherein:
- the charge pump circuitry is configured to sense a current provided to the first battery charging terminal and indicate the sensed current to the voltage regulator.

5. The circuit of claim 1, wherein the charge pump circuitry comprises:
- a first charge pump having an input coupled to the output of the voltage regulator; and
- a second charge pump having an input coupled to an output of the first charge pump and an output coupled to the first battery charging terminal.

6. The circuit of claim 5, wherein:
- a reference terminal of the first charge pump is coupled to a reference potential node of the circuit; and
- a reference terminal of the second charge pump is coupled to the output of the voltage regulator.

7. The circuit of claim 6, wherein:
- the input of the second charge pump is coupled to a second battery charging terminal that is configured to couple to another terminal of the first battery cell and is configured to couple to a terminal of a second battery cell of the battery pack;
- the input of the first charge pump is coupled to a third battery charging terminal that is configured to couple to another terminal of the second battery cell and is configured to couple to a terminal of a third battery cell of the battery pack; and
- the reference potential node is coupled to the reference terminal of the first charge pump and is configured to couple to another terminal of the third battery cell.

8. The circuit of claim 1, further comprising:
- another charge pump having an input coupled to the output of the voltage regulator, and having an output coupled to a system voltage supply node.

9. The circuit of claim 8, wherein:
- the charge pump circuitry is configured to generate the charging signal having a voltage greater than a voltage at the output of the voltage regulator; and
- the another charge pump is configured to generate a voltage supply signal at the system voltage supply node having a voltage lower than the voltage at the output of the voltage regulator.

10. The circuit of claim 8, further comprising:
- a sense transistor coupled between the input of the another charge pump and the input of the charge pump circuitry.

11. The circuit of claim 8, wherein:
- a reference terminal of the charge pump circuitry is coupled to an output of the another charge pump; and
- a reference terminal of the another charge pump is coupled to a reference potential node of the circuit.

12. The circuit of claim 8, wherein the voltage regulator comprises a buck-boost switch-mode regulator.

13. The circuit of claim 1, further comprising:
- another charge pump having an input coupled to the output of the charge pump circuitry and an output coupled to a high-voltage supply node.

14. The circuit of claim 1, wherein the voltage regulator comprises a sense transistor configured to sense an output current of the voltage regulator.

15. The circuit of claim 1, wherein the voltage regulator comprises a switch-mode voltage regulator.

16. The circuit of claim 1, wherein the charge pump circuitry comprises a capacitive element and is configured to generate an output voltage at the output of the charge pump circuitry, the charge pump circuitry configured to:

couple the capacitive element between an input terminal of the charge pump circuitry and a reference terminal of the charge pump circuitry during a first time period; and couple the capacitive element between the input terminal of the charge pump circuitry and an output terminal of the charge pump circuitry during a second time period.

17. The circuit of claim 1, further comprising:

an inductive element coupled between the output of the voltage regulator and the input of the charge pump circuitry.

18. A method for charging a battery pack, the method comprising:

generating a regulated voltage based on an input voltage;

generating a charging signal, via a first charge pump, based on the regulated voltage, the charging signal having a voltage higher than the regulated voltage; and charging a battery pack having multiple battery cells via the charging signal.

19. The method of claim 18, wherein:

a reference terminal of the first charge pump is coupled to a terminal of a first battery cell of the multiple battery cells; and the charging signal is provided to a terminal of a second battery cell of the multiple battery cells, another terminal of the first battery cell being coupled to another terminal of the second battery cell.

20. The method of claim 19, further comprising:

determining an amount of current output from the first charge pump, wherein the regulated voltage is generated based on the amount of current.

21. The method of claim 18, further comprising:

generating, via a second charge pump, an intermediary signal based on the regulated voltage, the intermediary signal having a voltage higher than the regulated voltage, wherein the charging signal is generated based on the intermediary signal.

22. The method of claim 21, wherein:

a reference terminal of the second charge pump is coupled to a first terminal of a first battery cell of the multiple battery cells;

the regulated voltage is provided to a second terminal of the first battery cell and to a first terminal of a second battery cell of the multiple battery cells;

the intermediary signal is provided to a first terminal of a third battery cell of the multiple battery cells and to a second terminal of the second battery cell; and the charging signal is provided to a second terminal of the third battery cell.

23. The method of claim 18, further comprising:

generating, via a second charge pump, a system voltage having a voltage lower than the regulated voltage, wherein a reference terminal of the first charge pump is coupled to a node for providing the system voltage.

24. The method of claim 23, further comprising:

generating, via a third charge pump, a high-voltage signal based on the charging signal and having a voltage higher than a voltage of the charging signal, wherein a reference terminal of the third charge pump is coupled to a node for providing the regulated voltage.

25. The method of claim 18, wherein the generating the charging signal via the first charge pump comprises:

coupling a capacitive element between a node for providing the regulated voltage and a reference terminal of the first charge pump during a first time period; and coupling the capacitive element between an input terminal of the first charge pump and an output terminal of the first charge pump during a second time period.

26. A circuit for battery charging, the circuit comprising:

a battery pack having multiple battery cells;

a voltage regulator; and charge pump circuitry configured to generate a charging signal at an output of the charge pump circuitry, the charge pump circuitry having an input coupled to an output of the voltage regulator, and the output of the charge pump circuitry coupled to a first terminal of a first battery cell of the multiple battery cells.

27. The circuit of claim 26, wherein:

a reference terminal of the charge pump circuitry is coupled to a reference potential node of the circuit.

28. The circuit of claim 27, wherein:

the input of the charge pump circuitry is coupled to a second terminal of the first battery cell and a first terminal of a second battery cell of the multiple battery cells; and the reference potential node is coupled to a second terminal of the second battery cell.

29. The circuit of claim 26, wherein the charge pump circuitry comprises:

a first charge pump having an input coupled to the output of the voltage regulator; and a second charge pump having an input coupled to an output of the first charge pump and an output coupled to the first terminal of the first battery cell.

30. The circuit of claim 29, wherein:

a reference terminal of the first charge pump is coupled to a reference potential node of the circuit; and a reference terminal of the second charge pump is coupled to the output of the voltage regulator.

* * * * *